United States Patent
Rhee

(10) Patent No.: US 11,764,102 B2
(45) Date of Patent: Sep. 19, 2023

(54) ROTATING SHAFT SEALING DEVICE AND PROCESSING APPARATUS FOR SEMICONDUCTOR SUBSTRATE USING THE SAME

(71) Applicant: SEALINK CORP., Seoul (KR)

(72) Inventor: Hee Jang Rhee, Gunpo-si (KR)

(73) Assignee: SEALINK CORP., Seoul (KR)

( * ) Notice: Subject to any disclaimer, the term of this patent is extended or adjusted under 35 U.S.C. 154(b) by 362 days.

(21) Appl. No.: 17/126,463

(22) Filed: Dec. 18, 2020

(65) Prior Publication Data

US 2021/0398844 A1 Dec. 23, 2021

(30) Foreign Application Priority Data

Jun. 19, 2020 (KR) .......................... 10-2020-0075341

(51) Int. Cl.
| | |
|---|---|
| *H01L 21/687* | (2006.01) |
| *C23C 14/56* | (2006.01) |
| *C23C 14/50* | (2006.01) |
| *C23C 16/44* | (2006.01) |
| *C23C 16/458* | (2006.01) |

(52) U.S. Cl.
CPC ...... *H01L 21/68792* (2013.01); *C23C 14/505* (2013.01); *C23C 14/566* (2013.01); *C23C 16/4408* (2013.01); *C23C 16/4409* (2013.01); *C23C 16/4584* (2013.01)

(58) Field of Classification Search
None
See application file for complete search history.

(56) References Cited

U.S. PATENT DOCUMENTS

| | | | | |
|---|---|---|---|---|
| 5,630,881 A | * | 5/1997 | Ogure | H01L 21/68792 118/733 |
| 5,976,312 A | * | 11/1999 | Shimizu | H01L 21/67063 156/345.55 |
| 6,030,457 A | * | 2/2000 | Shimazu | C23C 16/4401 118/733 |

(Continued)

FOREIGN PATENT DOCUMENTS

| | | |
|---|---|---|
| JP | 10321532 A | 12/1998 |
| JP | 2004036897 A | 2/2004 |

(Continued)

*Primary Examiner* — Sylvia MacArthur
(74) *Attorney, Agent, or Firm* — Dinsmore & Shohl LLP; Yongsok Choi, Esq.

(57) ABSTRACT

Provided is a rotating shaft sealing device. The rotating shaft sealing device mounted in a semiconductor substrate processing apparatus that processes a semiconductor substrate while rotating a semiconductor loading unit accommodating the semiconductor substrate, includes: a housing that is hollow and mounted in the semiconductor substrate processing apparatus; a rotating shaft accommodated in the housing and connected to the semiconductor loading unit to transfer a rotational force to the semiconductor loading unit; a bearing rotatably supporting the rotating shaft in the housing; a sealing unit including a plurality of seals arranged in the housing to tightly seal a gap between the housing and the rotating shaft; and a power transfer unit mounted at an end of the rotating shaft to transfer a rotational force to the rotating shaft.

16 Claims, 7 Drawing Sheets

(56) References Cited

U.S. PATENT DOCUMENTS

| | | | |
|---|---|---|---|
| 6,957,956 B2* | 10/2005 | Toba | H01L 21/67109 |
| | | | 432/237 |
| 7,795,143 B2* | 9/2010 | Maeda | H01L 21/67126 |
| | | | 438/678 |
| 8,043,431 B2* | 10/2011 | Ozaki | C23C 16/4401 |
| | | | 432/244 |
| 8,591,657 B2* | 11/2013 | Nakada | C23C 16/4401 |
| | | | 118/730 |
| 2002/0132497 A1* | 9/2002 | Tometsuka | C23C 16/4409 |
| | | | 438/782 |
| 2010/0055918 A1* | 3/2010 | Nakada | C23C 16/4401 |
| | | | 438/758 |
| 2020/0355247 A1* | 11/2020 | Rhee | C23C 16/45514 |
| 2020/0378500 A1* | 12/2020 | Rhee | F16J 15/3248 |
| 2021/0396318 A1* | 12/2021 | Rhee | F16J 15/43 |
| 2021/0398844 A1* | 12/2021 | Rhee | C23C 16/4408 |

FOREIGN PATENT DOCUMENTS

| | | | | |
|---|---|---|---|---|
| JP | 2015132379 A | * | 7/2015 | F16C 33/7886 |
| KR | 20040089287 A | | 10/2004 | |
| KR | 20050069735 A | * | 7/2005 | B24B 57/02 |
| KR | 100756029 B1 | * | 9/2007 | F04B 35/00 |
| KR | 101556356 B1 | * | 10/2015 | C23C 16/4557 |
| WO | WO-2007001100 A1 | * | 1/2007 | B24B 37/04 |

\* cited by examiner

ROTATING SHAFT SEALING DEVICE AND PROCESSING APPARATUS FOR SEMICONDUCTOR SUBSTRATE USING THE SAME

CROSS-REFERENCE TO RELATED APPLICATION

This application claims the benefit of Korean Patent Application No. 10-2020-0075341, filed on Jun. 19, 2020, in the Korean Intellectual Property Office, the disclosure of which is incorporated herein in its entirety by reference.

BACKGROUND

1. Field

One or more embodiments relate to a rotating shaft sealing device and a semiconductor substrate processing apparatus using the same, and more particularly, to a rotating shaft sealing device for preventing leakage of a fluid between a rotating shaft and a housing and a semiconductor substrate processing apparatus using the rotating shaft sealing device.

2. Description of the Related Art

Semiconductor equipment are used for mass production of integrated circuits. In depositing a thin film having a certain thickness on a substrate such as a semiconductor wafer or glass, a physical vapor deposition (PVD) method such as sputtering or a chemical vapor deposition (CVD) method using a chemical reaction, or the like are used. Examples of the CVD include an atmospheric pressure CVD method, a low-pressure CVD method, and a plasma enhanced CVD method. In layer forming processing, oxidized processing, annealing and diffusion of impurities of a semiconductor wafer, a furnace equipment for thermal treatment of a substrate is used.

In these semiconductor equipment, a rotating shaft sealing device for vacuum pressure equipment is used. A rotating shaft sealing device is provided on an outer circumferential surface of a shaft that faces a high-pressure area and a low-pressure area and rotates therebetween, in order to seal the high-pressure and the low-pressure area to each other.

A sealing device for vacuum pressure equipment, according to the related art, includes a housing and a rotating shaft that passes through the housing to be coupled to the housing. The rotating shaft faces a high-pressure area and a low-pressure area, and the housing is located on a boundary surface between the high-pressure area and the low-pressure area. Also, a seal for sealing is provided between the housing and the rotating shaft. The seal for sealing is to seal a space between the housing and the rotating shaft, and friction is caused also between the rotating shaft and the seal for sealing.

In the sealing device as above, there is a need to prevent leakage of foreign substances into a semiconductor vacuum pressure equipment or a flow of foreign substances from the semiconductor vacuum pressure equipment, the other way.

SUMMARY

One or more embodiments provide a rotating shaft sealing device having a simple and compact structure, for which there is no need to supply an additional lubricant, and a semiconductor substrate processing apparatus using the rotating shaft sealing device.

One or more embodiment provide a rotating shaft sealing device, in which vibration of a rotating shaft may be minimized, and foreign substances such as particles may be prevented from flowing from a semiconductor substrate processing apparatus into the rotating shaft sealing device, and leakage of foreign substances from the rotating shaft sealing device into the semiconductor substrate processing apparatus.

The objectives to be solved according to the embodiments are not limited to those mentioned above, and other objectives that are not mentioned herein will be clearly understood by those skilled in the art from the following description.

According to one or more embodiments, a rotating shaft sealing device mounted in a semiconductor substrate processing apparatus that processes a semiconductor substrate while rotating a semiconductor loading unit accommodating the semiconductor substrate, includes: a housing that is hollow and mounted in the semiconductor substrate processing apparatus; a rotating shaft accommodated in the housing and connected to the semiconductor loading unit to transfer a rotational force to the semiconductor loading unit; a bearing rotatably supporting the rotating shaft in the housing; a sealing unit including a plurality of seals arranged in the housing to tightly seal a gap between the housing and the rotating shaft; and a power transfer unit mounted at an end of the rotating shaft to transfer a rotational force to the rotating shaft.

The sealing unit may be arranged above the bearing to be close to a flange portion of the housing, the flange portion being coupled to the semiconductor substrate processing apparatus, and the power transfer unit may be arranged below the bearing.

Also, the sealing unit may include: at least one vacuum seal maintaining a vacuum of the semiconductor substrate processing apparatus; and at least one elastic seal supporting the rotating shaft and reducing vibration, wherein the at least one vacuum seal and the at least one elastic seal include a plastic material, and the at least one elastic seal has a higher elasticity than the at least one vacuum seal.

Also, the at least one vacuum seal may include a rib seal in which a curved rib is formed on an inner circumference of a ring-shaped seal ring, and the at least one elastic seal may include an elastic member inserted into a seal body.

Also, a ring-shaped anti-rotation member may be provided on outer circumferential surfaces of the at least one vacuum seal and the at least one elastic seal, the outer circumferential surfaces facing the housing, to prevent relative rotation of the at least one vacuum seal and the at least one elastic seal in the housing with respect to the housing.

Also, the at least one vacuum seal and the at least one elastic seal may be arranged serially and adjacent to each other, wherein the at least one vacuum seal is arranged closer to a flange portion of the housing than the at least one elastic seal, the flange portion being coupled to the semiconductor substrate processing apparatus, and the at least one elastic seal is arranged closer to the bearing than the at least one vacuum seal.

Also, the sealing unit may further include a pressure seal to prevent foreign substances from flowing from the semiconductor substrate processing apparatus into the rotating shaft sealing device when an inner portion of the semiconductor substrate processing apparatus is pressurized.

Also, a labyrinth seal may be provided above the sealing unit to prevent foreign substances from flowing from the semiconductor substrate processing apparatus into the housing.

Also, the housing may include a cooling water jacket provided along a circumference of the sealing unit to cool the sealing unit.

Also, the housing may include: a purge gas inflow path provided in the housing to prevent foreign substances from flowing from the semiconductor substrate processing apparatus into the housing; and a purge gas inflow port provided on a side surface of the housing to allow a purge gas to flow from the outside through the purge gas inflow path.

Also, a labyrinth seal may be provided above the sealing unit to prevent foreign substances from flowing from the semiconductor substrate processing apparatus into the housing, and the purge gas that has moved through the purge gas inflow path may be supplied to the semiconductor substrate processing apparatus through the labyrinth seal.

According to one or more embodiments, a semiconductor substrate processing apparatus for processing a semiconductor substrate, includes: a process tube accommodating a plurality of semiconductor substrates therein; a semiconductor loading unit that is arranged within the process tube to be lifted or lowered; a nozzle unit provided inside the process tube to inject a process gas; a sealing cap connected to the semiconductor loading unit and tightly sealing a lower portion of the process tube; and a rotating shaft sealing device configured to perform a sealing function while rotating the semiconductor loading unit, wherein the rotating shaft sealing device includes: a housing that is hollow and mounted on the sealing cap; a rotating shaft accommodated in the housing and connected to the semiconductor loading unit to transfer a rotational force to the semiconductor loading unit; a bearing rotatably supporting the rotating shaft in the housing; a sealing unit including a plurality of seals tightly sealing a gap between the housing and the rotating shaft; and a power transfer unit mounted at an end of the rotating shaft to transfer a rotational force to the rotating shaft.

Also, the sealing unit may be arranged above the bearing to be close to a flange portion of the housing, the flange portion being coupled to the sealing cap, and the power transfer unit may be arranged below the bearing.

Also, the sealing unit may include: at least one vacuum seal maintaining a vacuum of the process tube; and at least one elastic seal supporting the rotating shaft and reducing vibration, wherein the at least one vacuum seal and the at least one elastic seal include a plastic material, and the at least one elastic seal has a higher elasticity than the at least one vacuum seal.

Also, the at least one vacuum seal may include a rib seal in which a curved rib is formed on an inner circumference of a ring-shaped seal ring, and the at least one elastic seal includes an elastic member inserted into a seal body.

Also, a ring-shaped anti-rotation member may be provided on outer circumferential surfaces of the at least one vacuum seal and the at least one elastic seal, the outer circumferential surfaces facing the housing, to prevent relative rotation of the at least one vacuum seal and the at least one elastic seal in the housing with respect to the housing.

Also, the at least one vacuum seal and the at least one elastic seal may be arranged serially and adjacent to each other, wherein the at least one vacuum seal is arranged closer to a flange portion of the housing than the at least one elastic seal, the flange portion being coupled to the semiconductor substrate processing apparatus, and the at least one elastic seal is arranged closer to the bearing than the at least one vacuum seal.

Also, the sealing unit may further include a pressure seal to prevent foreign substances from flowing from the process tube into the rotating shaft sealing device when an inner portion of the process tube is pressurized.

Also, a labyrinth seal may be provided above the sealing unit to prevent foreign substances generated in the process tube from flowing into the housing.

Also, the housing may include a cooling water jacket provided along a circumference of the sealing unit to cool the sealing unit.

Also, the housing may include: a purge gas inflow path provided in the housing to prevent foreign substances generated in the process tube from flowing into the housing; and a purge gas inflow port provided on a side surface of the housing to allow a purge gas to flow from the outside through the purge gas inflow path.

Also, a labyrinth seal may be provided above the sealing unit to prevent foreign substances generated in the process tube from flowing into the housing, and the purge gas that has moved through the purge gas inflow path may be supplied to the process tube through the labyrinth seal.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
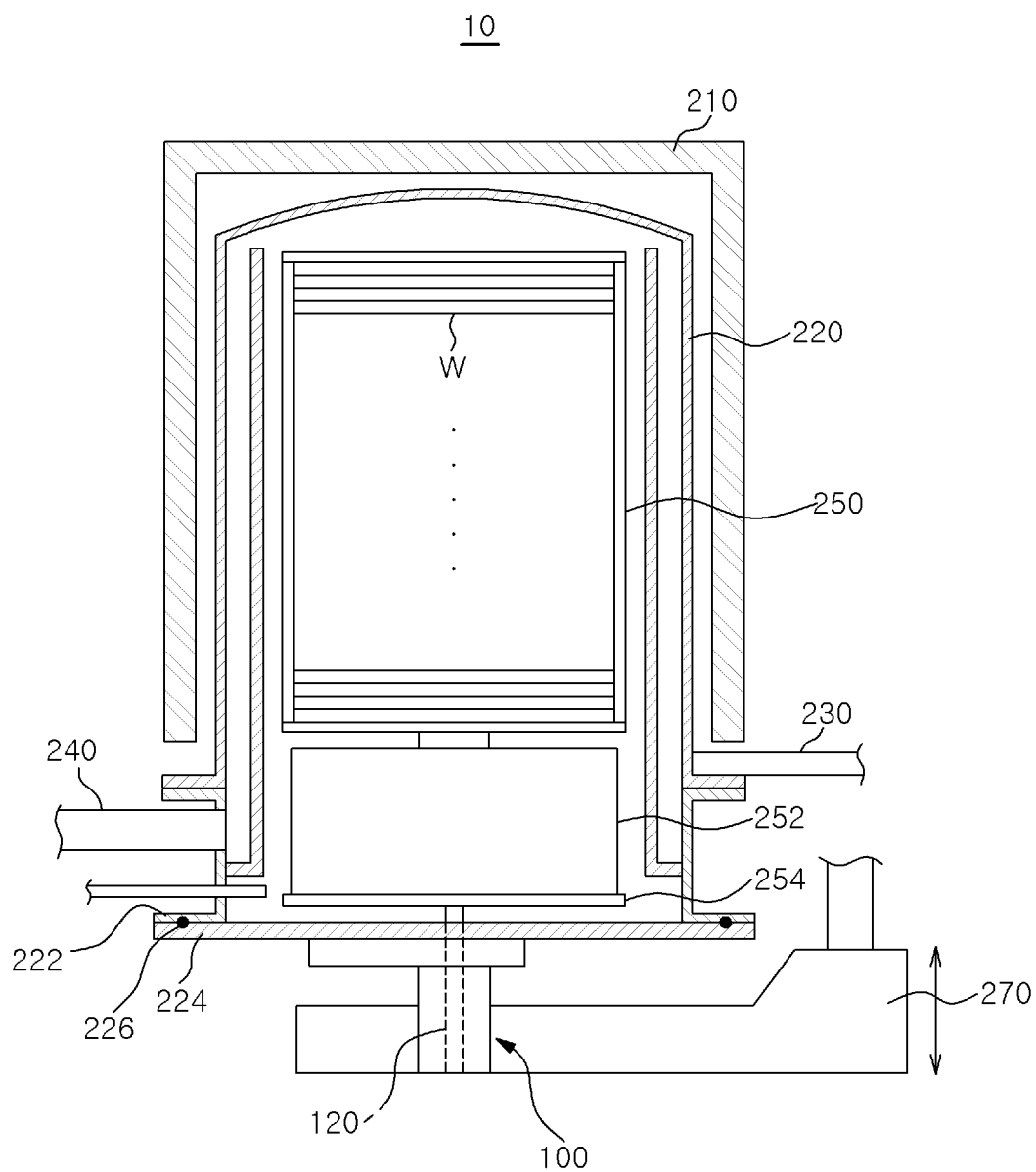
FIG. 1 is a diagram illustrating a rotating shaft sealing device and a semiconductor substrate processing apparatus, according to an embodiment of the present disclosure.

Hereinafter, embodiments of the present disclosure will be described more fully with reference to the accompanying drawings, in which the embodiments of the present disclosure are shown such that one of ordinary skill in the art may easily work the present disclosure. The present disclosure may, however, be embodied in many different forms and should not be construed as limited to the embodiments set forth herein. Also, in the drawings, portions unrelated to the description are omitted for the clear description of the embodiments of the present disclosure.

The terms used in the present specification are merely used to describe particular embodiments, and are not intended to limit the present disclosure. The singular forms may include the plural forms unless the context clearly indicates otherwise.

In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Also, these embodiments are provided so that this disclosure will be thorough and complete, and will fully convey the concept of the present disclosure to those skilled in the art. In the drawings, the shapes and sizes of elements may be exaggerated for clarity.

Hereinafter, preferred embodiments of the present disclosure will now be described more fully with reference to the accompanying drawings.

Figure 2:
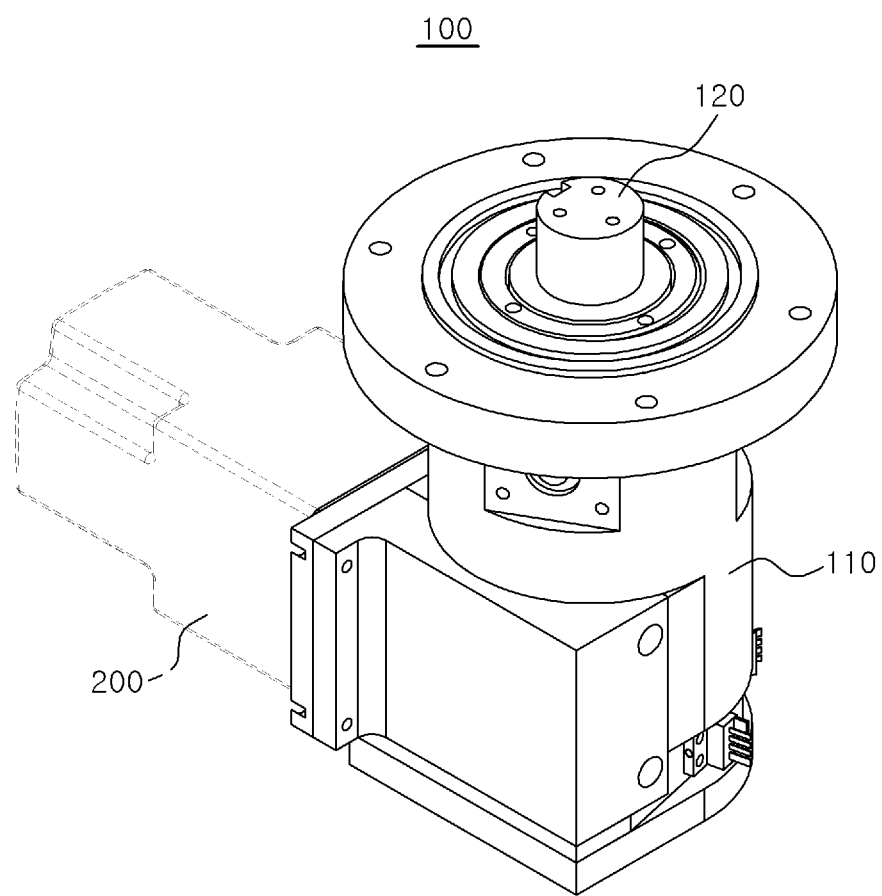
FIG. 2 is a perspective view illustrating a rotating shaft sealing device according to an embodiment of the present disclosure.
Figure 3:
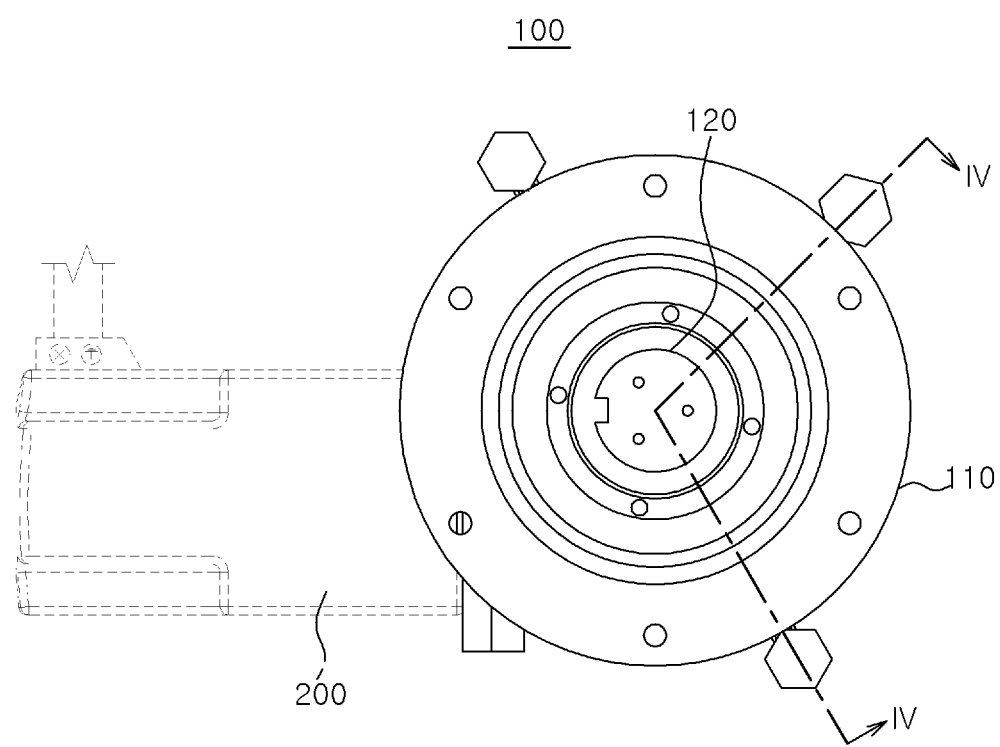
FIG. 3 is a plan view of the rotating shaft sealing device of FIG. 2.
Figure 4:
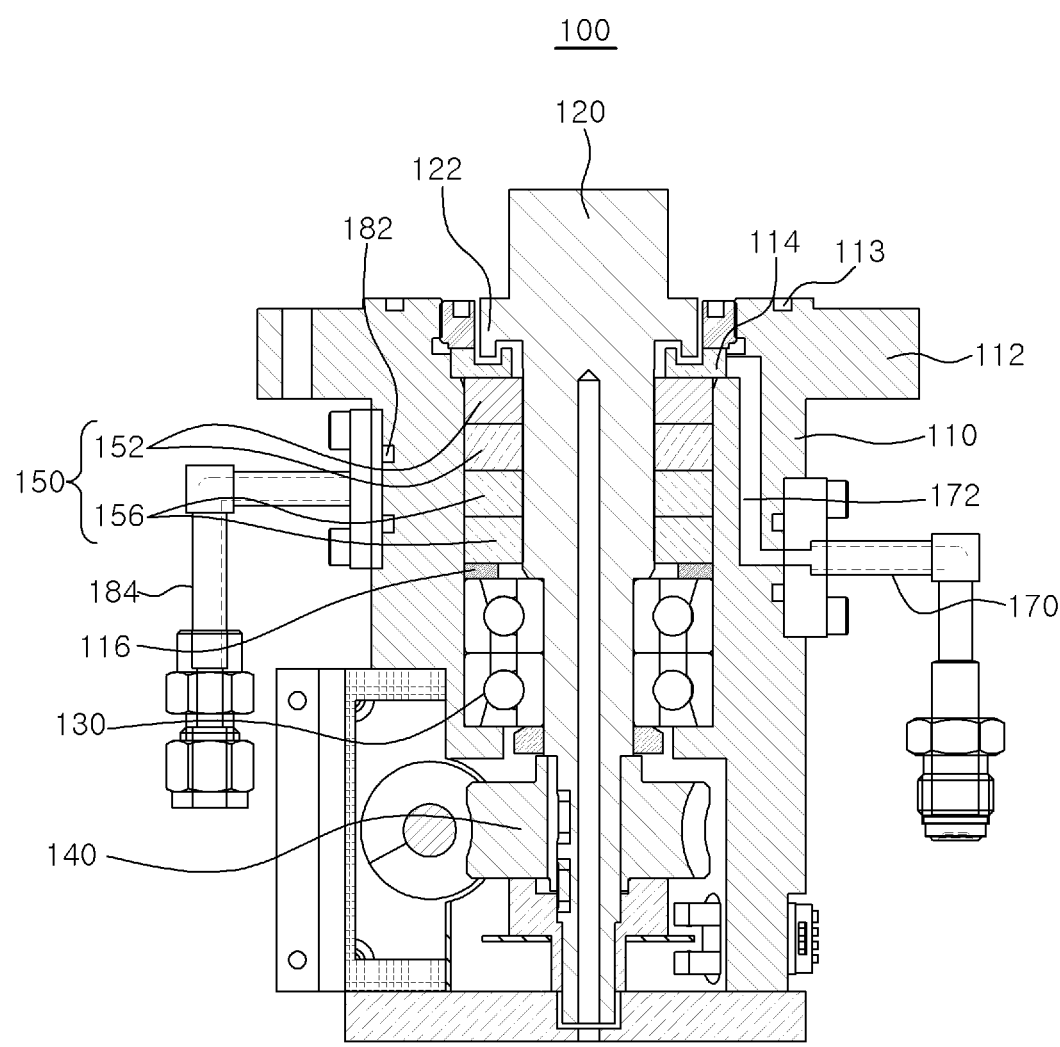
FIG. 4 is a cross-sectional view of the rotating shaft sealing device taken along line IV-IV of FIG. 2.

FIG. 1 is a diagram illustrating a rotating shaft sealing device and a semiconductor substrate processing apparatus, according to an embodiment of the present disclosure. FIG. 2 is a perspective view illustrating a rotating shaft sealing device according to an embodiment of the present disclosure. FIG. 3 is a plan view of the rotating shaft sealing device of FIG. 2. FIG. 4 is a cross-sectional view of the rotating shaft sealing device taken along line IV-IV of FIG. 2.

First, referring to FIG. 1, a semiconductor substrate processing apparatus 10 according to an embodiment of the present disclosure may be, for example, a bell-type furnace equipment for thermally treating a semiconductor substrate. The semiconductor substrate processing apparatus 10 includes a process tube 220, a semiconductor loading unit 250, a nozzle unit 230, a sealing cap 224, and a rotating shaft sealing device 100.

The process tube 220 has a space accommodating a plurality of semiconductor substrates W that are to be thermally treated, and has an open floor, and the floor may be closed or opened using the sealing cap 224. When the floor of the process tube 220 is closed using the sealing cap 224, an O-ring 226 may be provided between a flange 222 of the process tube 220 and the sealing cap 224 to be tightly sealed.

The semiconductor loading unit 250 is provided to hold the plurality of semiconductor substrates W, and may be arranged in the process tube 220 to be lifted or lowered. In detail, the semiconductor loading unit 250 may hold the semiconductor substrates W, which are substrates to be processed, apart from each other by a certain distance in a vertical direction. A heat reserving apparatus 252 and a turntable 254 may be provided below the semiconductor loading unit 250. The semiconductor loading unit 250, the heat reserving apparatus 252, and the turntable 254 may be lifted or lowered, together with the sealing cap 224, with respect to the process tube 220 by using an elevator apparatus 270. At a position where the semiconductor loading unit 250 is lowered, the plurality of semiconductor substrates W may be arranged in the semiconductor loading unit 250, and at a position where the semiconductor loading unit 250 is lifted, the semiconductor loading unit 250 is accommodated in the process tube 220 and a floor portion of the process tube 220 may be closed by the sealing cap 224 to be tightly sealed.

In the process tube 220, the nozzle unit 230 used to inject a process gas to process the semiconductor substrates W may be provided and an exhaust pipe 240 to discharge the process gas and maintain an inner portion of the process tube 220 in a vacuum may be provided.

Also, a heater assembly 210 for heat the process tube 220 may be arranged around the process tube 220. The heater assembly 210 may thermally treat the semiconductor substrates W accommodated in the semiconductor loading unit 250, by using radiation heat.

The rotating shaft sealing device 100 is provided to perform a sealing function while rotating the semiconductor loading unit 250. A shaft through hole may be formed in a center portion of the sealing cap 224, and an end of a rotating shaft 120 of the rotating shaft sealing device 100 may pass through the shaft through hole to protrude. The turntable 254 may be connected to the protruding end of the rotating shaft 120. Accordingly, the turntable 254 is rotated according to rotation of the rotating shaft 120, and the semiconductor loading unit 250 on the turntable 254 may also be rotated.

Referring to FIGS. 2 through 4, the rotating shaft sealing device 100 is provided to rotate the semiconductor loading unit 250. The rotating shaft sealing device 100 may include a housing 110, the rotating shaft 120, a bearing 130, a sealing unit 150, and a power transfer unit 140.

The housing 110 is hollow and may accommodate the rotating shaft 120, the bearing 130, the sealing unit 150, and the power transfer unit 140 therein. A flange portion 112 that is mounted on a semiconductor substrate processing apparatus may be provided in an upper portion of the housing 110. For example, when a semiconductor substrate processing apparatus is a furnace equipment as illustrated in FIG. 1, the rotating shaft sealing device 100 may be mounted below the sealing cap 224. An O-ring 113 may be provided in the flange portion 112 to tightly seal between the flange portion 112 and the sealing cap 224. Also, a driving apparatus 200 such as a motor may be provided at one end of the housing 110.

The bearing 130 may be provided in the housing 110 to rotatably support the rotating shaft 120 in the housing 110. In the present embodiment, the bearing 130 may be provided above the power transfer unit 140 and located approximately in a middle portion of the housing 110 as a whole, thereby reducing vibration of the rotating shaft 120 and stably supporting the rotating shaft 120. In the present embodiment, the bearing 130 may be a thrust bearing, specifically, a double-row angular contact bearing. The bearing 130, which is a double-row angular contact bearing, may support a load applied to the rotating shaft 120 to support a load of the semiconductor loading unit 250 accommodating the plurality of semiconductor substrates W. Meanwhile, a spacer 116 may be provided to fill a space between the bearing 130 and the sealing unit 150 may be provided.

The sealing unit 150 is provided to tightly seal a gap between the housing 110 and the rotating shaft 120. The sealing unit 150 provides tight sealing to prevent foreign substances (e.g., particles) generated in the rotating shaft sealing device 100 from flowing into a semiconductor substrate processing apparatus that is provided above the rotating shaft sealing device 100 and is in a vacuum and to maintain the inside of the semiconductor substrate processing apparatus in a vacuum. As the sealing unit 150, a plurality of seals may be arranged in combination. The sealing unit 150 will be described in further detail later.

The power transfer unit 140 is provided at an end of the rotating shaft 120, that is, below the bearing 130 in the present embodiment, to transfer a rotational force to the rotating shaft 120. A rotational force generated in the driving apparatus 200 such as a motor may be transferred to the rotating shaft 120 via the power transfer unit 140. In the present embodiment, the power transfer unit 140 may be included using a worm gear to convert a direction of a rotational force generated in the driving apparatus 200. Accordingly, a height of the housing 110 may be lowered, and a compact size of the rotating shaft sealing device 100 may be realized, thereby saving space and allowing easy installation and also replacement and maintenance.

In the present embodiment, the sealing unit 150 may be arranged to be closer to the flange portion 112 of the housing 110 coupled to the semiconductor substrate processing apparatus than the bearing 130, that is, above the bearing 130. Also, the power transfer unit 140 may be arranged below the bearing 130. Accordingly, a flow of foreign substances such as particles, which may be generated during an operation of the bearing 130, due to a pressure difference, into the semiconductor substrate processing apparatus, may be prevented. Also, as the bearing 130 is disposed between the power transfer unit 140 and the sealing unit 150, the rotating shaft 120 may be stably supported.

Meanwhile, when the semiconductor substrate processing apparatus is operated in a high-temperature environment, for example, in a furnace equipment, the sealing unit 150 is arranged adjacent to the flange portion 112 to be closer to the semiconductor substrate processing apparatus than other components, and accordingly, a temperature of the sealing unit 150 among the components of the rotating shaft sealing device 100 may be relatively high. In the present embodiment, a cooling water jacket 182 may be provided in a portion of the housing 110, the portion corresponding to a circumference of the sealing unit 150 to cool the sealing unit 150. Accordingly, the lifetime of a plurality of seals, that is, vacuum seals 152 and elastic seals 156 provided in the sealing unit 150 may be extended by reducing a temperature of the sealing unit 150.

Meanwhile, a pressure in the semiconductor substrate processing apparatus may change to an atmospheric pressure or higher, instead of a vacuum, due to an end of a treatment process of semiconductor substrates or cleaning in the semiconductor substrate processing apparatus. In this case, an internal pressure of the semiconductor substrate processing apparatus may be higher than a pressure inside the rotating shaft sealing device 100 instead. Consequently, foreign substances such as particles remaining in the semiconductor substrate processing apparatus may flow inversely into the rotating shaft sealing device 100. According to the present embodiment, a labyrinth seal 114 may be provided in the flange portion 112 of the housing 110 to prevent this.

In addition, according to the present embodiment, to prevent the foreign substances such as particles remaining in the semiconductor substrate processing apparatus from flowing into the rotating shaft sealing device 100, a purge gas inflow path 172 may be provided in a wall body of the housing 110. In addition, a purge gas inflow port 170 may be provided on a side surface of the housing 110 to allow a purge gas to flow from the outside through the purge gas inflow path 172. The purge gas inflow path 172 may extend upwards in the wall body of the housing 110 toward the flange portion 112, and may communicative with the labyrinth seal 114 provided in the flange portion 112. Accordingly, a purge gas that flows through the purge gas inflow path 172 may pass through the labyrinth seal 114 to be supplied toward the semiconductor substrate processing apparatus.

Figure 5:
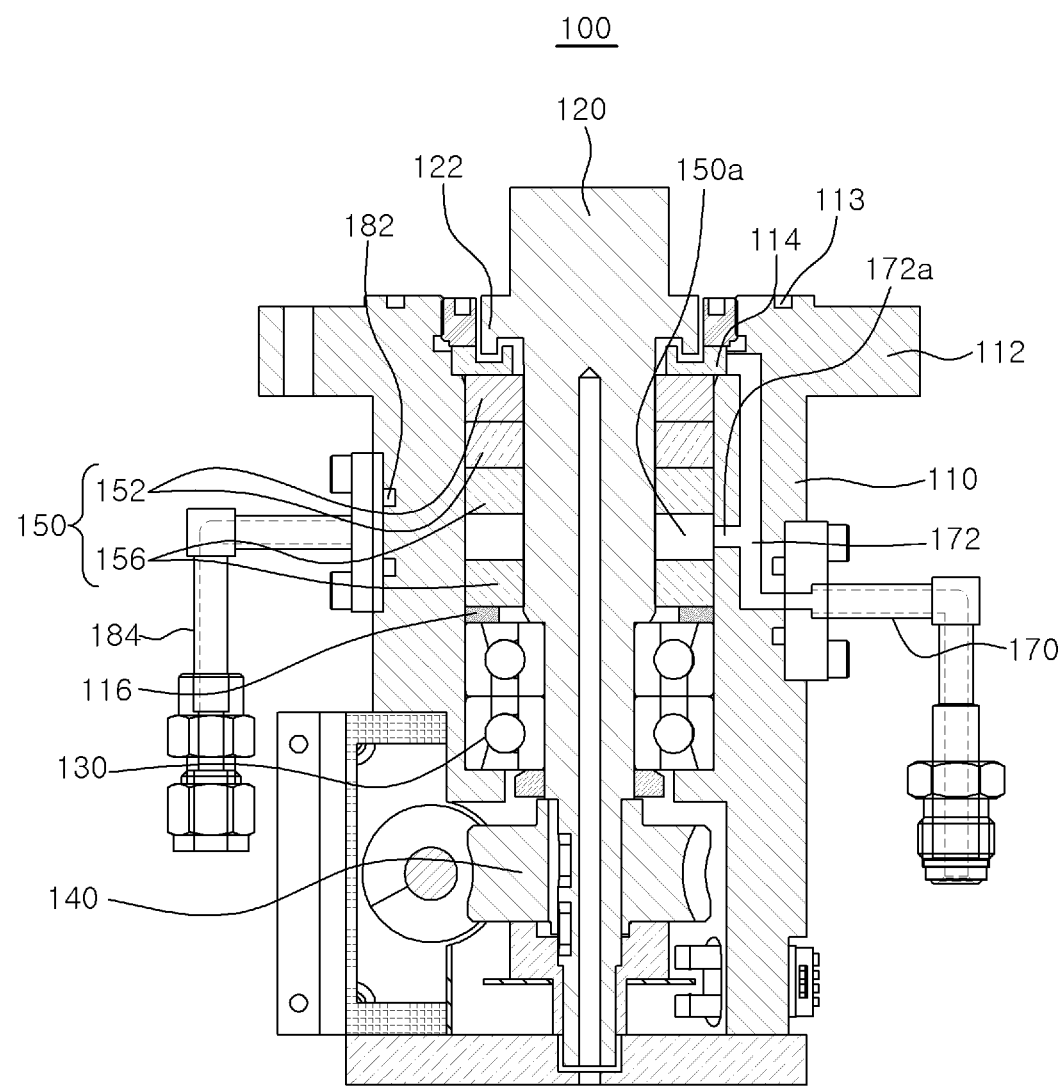
FIG. 5 is a cross-sectional view illustrating a rotating shaft sealing device according to another embodiment of the present disclosure.

FIG. 5 is a cross-sectional view illustrating a rotating shaft sealing device 100 according to another embodiment of the present disclosure.

Referring to FIG. 5, the rotating shaft sealing device 100 according to the other embodiment of the present disclosure is identical to the rotating shaft sealing device 100 illustrated in FIG. 4, except that the purge gas inflow path 172 includes a branch portion 172a additionally provided toward the sealing unit 150. As the purge gas inflow path 172 communicates with a buffer space 150a in the sealing unit 150 by using the branch portion 172a, also when foreign substances such as particles are left between seals of the sealing unit 150, they may be cleaned using a purge gas. In the present embodiment, the buffer space 150a may be between elastic seals 156.

Meanwhile, a vacuum pump (not shown) may be connected to the purge gas inflow path 172. Accordingly, the buffer space 150a communicating with the branch portion 172a may be maintained in a vacuum. Thus, even when some of vacuum seals 152 are damaged, due to the buffer space 150a in which a vacuum is formed, a vacuum may be maintained in an area A.

Hereinafter, a structure of a sealing unit used in the rotating shaft sealing device described above will be described in detail with reference to FIG. 6.

Figure 6:
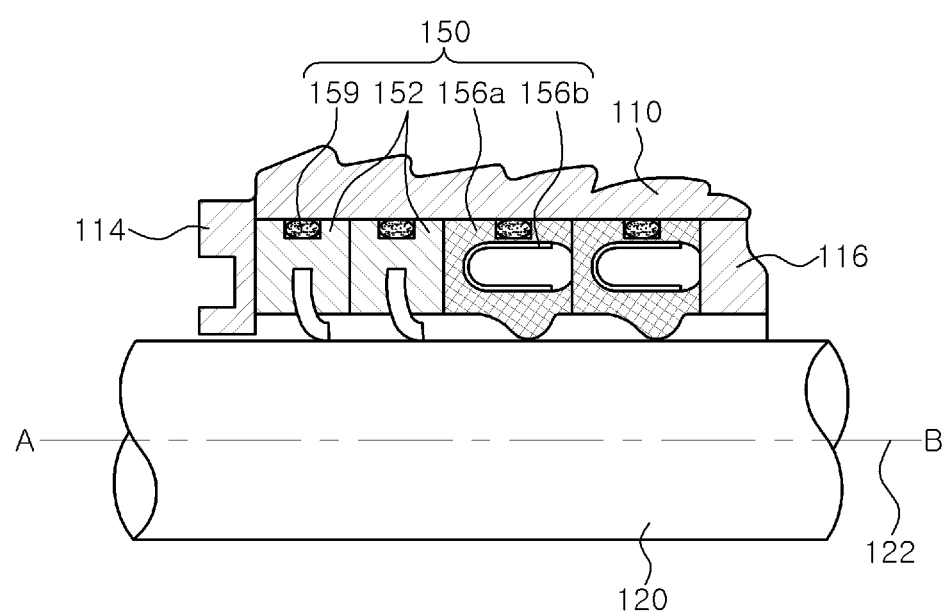
FIG. 6 is a schematic view illustrating a structure of a sealing unit according to an embodiment of the present disclosure.

Referring to FIG. 6, the sealing unit 150 according to an embodiment of the present disclosure may include a plurality of vacuum seals 152 and a plurality of elastic seals 156. The vacuum seals 152 are provided to maintain a vacuum of a semiconductor substrate processing apparatus arranged above the rotating shaft sealing device 100, and the elastic seals 156 are provided to support the rotating shaft 120 and reduce vibration. The vacuum seals 152 and the elastic seals 156 may be both formed of a plastic material. Also, the elastic seals 156 may have a higher elasticity than the vacuum seals 152, for example, two times that of the vacuum seals 152.

The vacuum seals 152 may be plastic rib seals in which a curved rib is formed on an inner circumference of a ring-shaped seal ring, and may have a shape bent in an opposite direction from the area A to maintain a vacuum of the area A in which a vacuum is formed.

The elastic seals 156 support the rotating shaft 120, together with the bearing 130, to maintain a shaft line 122 without changing, due to, for example, vibration caused by rotation of the rotating shaft 120. Meanwhile, when the shaft line 122 is changed, a space between the rotating shaft 120 and the vacuum seals 152 may be widened, and foreign substances may flow through the space therebetween. In the present embodiment, even when the shaft line 122 is changed, since the elastic seals 156 are provided, foreign substances that have flown between the rotating shaft 120 and the vacuum seals 152 may be prevented from entering an area B. The elastic seals 156 may include a seal body 156a, which is formed of a plastic material and in which a recess is formed in a direction, and an elastic member 156b that is accommodated in the seal body 156a to pressurize the seal body 156a against the rotating shaft 120. The elastic member 156b may be, for example, an O-ring, a square ring, or a metal spring, but is not limited thereto.

The vacuum seals 152 and the elastic seals 156 may be arranged serially and adjacent to each other in a direction of the shaft line 122, and as illustrated in FIG. 4, the vacuum seals 152 may be arranged closer to the flange portion 112 of the housing 110 than the elastic seals 156, and the elastic seals 156 may be arranged closer to the bearing 130 than the vacuum seals 152. Also, the vacuum seals 152 and the elastic seals 156 may be provided in a plural number, and thus, also when any one of the vacuum seals 152 or any one of the elastic seals 156 is damaged, the function thereof may be maintained.

Also, to prevent the vacuum seals 152 and the elastic seals 156 from making relative rotation with respect to the housing 110 in the housing 110, an anti-rotation member 159 that is ring-shaped may be provided on outer circumferential surfaces of the vacuum seals 152 and the elastic seals 156, the outer circumferential surfaces facing the housing 110. The anti-rotation member 159 further pressurizes the vacuum seals 152 and the elastic seals 156 against the rotating shaft 120. Also, compared to when the anti-rotation member 159 is not included, that is, when the vacuum seals 152 and the elastic seals 156 directly contact an inner circumferential surface of the housing 110, friction between the anti-rotation member 159 and the vacuum seals 152 and the elastic seals 156 is greater. Accordingly, relative rotation of the vacuum seals 152 and the elastic seals 156 in the housing 110 with respect to the housing 110 may be prevented.

Also, when disassembling the rotating shaft sealing device 100 due to damage or inspection, or the like, even when a surface roughness of the housing 110 is relatively low, since the anti-rotation member 159 comes into friction with the inner circumferential surface of the housing 110 during the disassembly process, the sealing unit 150 may minimize damage due to the low surface roughness of the housing 110. Also, even when the anti-rotation member 159 is damaged to some extent, the anti-rotation member 159 may be reused, thus enabling easy disassembly and assembly of the rotating shaft sealing device 100.

Figure 7:
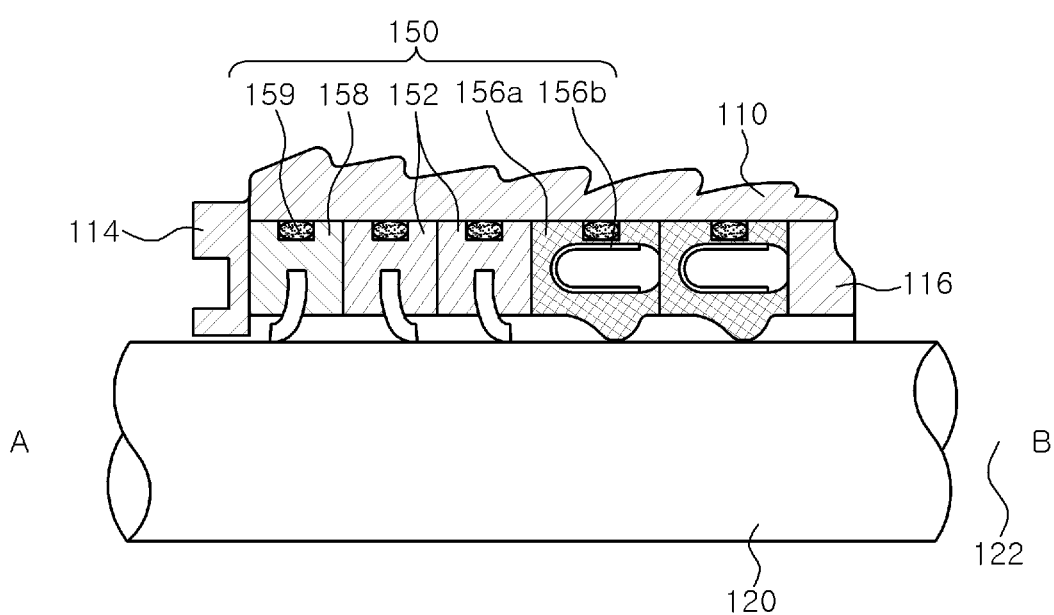
FIG. 7 is a schematic view illustrating a structure of a sealing unit according to another embodiment of the present disclosure.

FIG. 7 is a schematic view illustrating a structure of a sealing unit according to another embodiment of the present disclosure.

Referring to FIG. 7, the sealing unit according to the other embodiment of the present disclosure is identical to that of the embodiment illustrated in FIG. 6 except that a pressure seal 158 is further included. The pressure seal 158 is included to prevent foreign substances from flowing from a semiconductor substrate processing apparatus when an inner portion of the semiconductor substrate processing apparatus is pressurized due to, for example, cleaning. In the present embodiment, the pressure seal 158 is arranged more in front than the vacuum seals 152, that is, closer to the labyrinth seal 114 than the vacuum seals 152 are. Like the vacuum seals 152, the pressure seal 158 may be a plastic rib seal in which a curved rib is formed on an inner circumference of a ring-shaped seal ring. When the area A is pressurized as illustrated in FIG. 7, to prevent a flow of foreign substances from the area A, the pressure seal 158 may be curved toward the area A.

According to the rotating shaft sealing device and the semiconductor substrate processing apparatus using the same, according to the embodiments described above, a vacuum seal, a pressure seal, and an elastic seal make a line contact with a rotating object to minimize a frictional force, thus not requiring the supply of an additional lubricant and enabling a very compact and simple structure.

In addition, vibration of a rotating shaft of the rotating shaft sealing device may be minimized, and foreign substances such as particles may be prevented from flowing from the semiconductor substrate processing apparatus into the rotating shaft sealing device.

Also, as the rotating shaft sealing device includes a cooling water jacket, a sealing unit may be maintained at a low temperature, thereby prolonging the lifetime of the sealing unit.

Also, by arranging the sealing unit above a bearing, foreign substances generated in the bearing may be prevented from flowing into the semiconductor substrate processing apparatus.

Also, by supplying a purge gas above the sealing unit to thereby discharge the purge gas to the semiconductor substrate processing apparatus, foreign substances generated in the semiconductor substrate processing apparatus may be prevented from flowing into the sealing unit.

While the present disclosure has been particularly shown and described with reference to specific matters such as specific components and exemplary embodiments thereof and drawings, it will be understood by those of ordinary skill in the art that various changes in form and details may be made therein without departing from the spirit and scope of the present disclosure as defined by the appended claims. The exemplary embodiments should be considered in descriptive sense only and not for purposes of limitation.

Therefore, the scope of the present disclosure is defined not by the detailed description of the embodiments above but by the appended claims, and all differences within the scope will be construed as being included in the present disclosure.

What is claimed is:

1. A rotating shaft sealing device mounted in a semiconductor substrate processing apparatus that processes a semiconductor substrate while rotating a semiconductor loading unit accommodating the semiconductor substrate, the rotating shaft sealing device comprising:

a housing that is hollow and mounted in the semiconductor substrate processing apparatus;

a rotating shaft accommodated in the housing and connected to the semiconductor loading unit to transfer a rotational force to the semiconductor loading unit;

a bearing rotatably supporting the rotating shaft in the housing;

a sealing unit comprising a plurality of seals arranged in the housing to tightly seal a gap between the housing and the rotating shaft; and a power transfer unit mounted at an end of the rotating shaft to transfer a rotational force to the rotating shaft, wherein the sealing unit comprises:

at least one vacuum seal maintaining a vacuum of the semiconductor substrate processing apparatus; and at least one elastic seal supporting the rotating shaft and reducing vibration, wherein the at least one vacuum seal and the at least one elastic seal comprise a plastic material, and the at least one elastic seal has a higher elasticity than the at least one vacuum seal, and wherein the at least one vacuum seal and the at least one elastic seal are arranged serially and adjacent to each other, the at least one vacuum seal is arranged closer to a flange portion of the housing than the at least one elastic seal, the flange portion being coupled to the semiconductor substrate processing apparatus, and the at least one elastic seal is arranged closer to the bearing than the at least one vacuum seal.

2. The rotating shaft sealing device of claim 1, wherein the sealing unit is arranged above the bearing to be close to a flange portion of the housing, the flange portion being coupled to the semiconductor substrate processing apparatus, and the power transfer unit is arranged below the bearing.

3. The rotating shaft sealing device of claim 1, wherein the at least one vacuum seal comprises a rib seal in which a curved rib is formed on an inner circumference of a ring-shaped seal ring, and the at least one elastic seal comprises an elastic member inserted into a seal body.

4. The rotating shaft sealing device of claim 1, wherein a ring is provided on outer circumferential surfaces of the at least one vacuum seal and the at least one elastic seal, the outer circumferential surfaces facing the housing, to prevent relative rotation of the at least one vacuum seal and the at least one elastic seal in the housing with respect to the housing.

5. The rotating shaft sealing device of claim 1, wherein the sealing unit further comprises a pressure seal to prevent foreign substances from flowing from the semiconductor substrate processing apparatus into the rotating shaft sealing device when an inner portion of the semiconductor substrate processing apparatus is pressurized.

6. The rotating shaft sealing device of claim 1, wherein a labyrinth seal is provided above the sealing unit to prevent foreign substances from flowing from the semiconductor substrate processing apparatus into the housing.

7. The rotating shaft sealing device of claim 1, wherein the housing comprises a cooling water jacket provided along a circumference of the sealing unit to cool the sealing unit.

8. The rotating shaft sealing device of claim 1, wherein the housing comprises:

a purge gas inflow path provided in the housing to prevent foreign substances from flowing from the semiconductor substrate processing apparatus into the housing; and a purge gas inflow port provided on a side surface of the housing to allow a purge gas to flow from the outside through the purge gas inflow path.

9. The rotating shaft sealing device of claim 8, wherein a labyrinth seal is provided above the sealing unit to prevent foreign substances from flowing from the semiconductor substrate processing apparatus into the housing, and the purge gas that has moved through the purge gas inflow path is supplied to the semiconductor substrate processing apparatus through the labyrinth seal.

10. A semiconductor substrate processing apparatus for processing a semiconductor substrate, the semiconductor substrate processing apparatus comprising:

a process tube accommodating a plurality of semiconductor substrates therein;

a semiconductor loading unit that is arranged within the process tube to be lifted or lowered;

a nozzle unit provided inside the process tube to inject a process gas;

a sealing cap connected to the semiconductor loading unit and tightly sealing a lower portion of the process tube; and a rotating shaft sealing device configured to perform a sealing function while rotating the semiconductor loading unit, wherein the rotating shaft sealing device comprises:

a housing that is hollow and mounted on the sealing cap;

a rotating shaft accommodated in the housing and connected to the semiconductor loading unit to transfer a rotational force to the semiconductor loading unit;

a bearing rotatably supporting the rotating shaft in the housing;

a sealing unit comprising a plurality of seals tightly sealing a gap between the housing and the rotating shaft; and a power transfer unit mounted at an end of the rotating shaft to transfer a rotational force to the rotating shaft, wherein the sealing unit comprises:

at least one vacuum seal maintaining a vacuum of the process tube; and at least one elastic seal supporting the rotating shaft and reducing vibration, wherein the at least one vacuum seal and the at least one elastic seal comprise a plastic material, and the at least one elastic seal has a higher elasticity than the at least one vacuum seal, and wherein the at least one vacuum seal and the at least one elastic seal are arranged serially and adjacent to each other, wherein the at least one vacuum seal is arranged closer to a flange portion of the housing than the at least one elastic seal, the flange portion being coupled to the semiconductor substrate processing apparatus, and the at least one elastic seal is arranged closer to the bearing than the at least one vacuum seal.

11. The semiconductor substrate processing apparatus of claim 10, wherein the sealing unit is arranged above the bearing to be close to a flange portion of the housing, the flange portion being coupled to the sealing cap, and the power transfer unit is arranged below the bearing.

12. The semiconductor substrate processing apparatus of claim 10, wherein the at least one vacuum seal comprises a rib seal in which a curved rib is formed on an inner circumference of a ring-shaped seal ring, and the at least one elastic seal comprises an elastic member inserted into a seal body.

13. The semiconductor substrate processing apparatus of claim 10, wherein a ring is provided on outer circumferential surfaces of the at least one vacuum seal and the at least one elastic seal, the outer circumferential surfaces facing the housing, to prevent relative rotation of the at least one vacuum seal and the at least one elastic seal in the housing with respect to the housing.

14. The semiconductor substrate processing apparatus of claim 10, wherein the sealing unit further comprises a pressure seal to prevent foreign substances from flowing from the process tube into the rotating shaft sealing device when an inner portion of the process tube is pressurized.

15. The semiconductor substrate processing apparatus of claim 10, wherein a labyrinth seal is provided above the sealing unit to prevent foreign substances generated in the process tube from flowing into the housing.

16. The semiconductor substrate processing apparatus of claim 10, wherein the housing comprises a cooling water jacket provided along a circumference of the sealing unit to cool the sealing unit.

* * * * *